United States Patent
Rottstegge et al.

(10) Patent No.: US 7,125,640 B2
(45) Date of Patent: Oct. 24, 2006

(54) RESIST FOR PHOTOLITHOGRAPHY HAVING REACTIVE GROUPS FOR SUBSEQUENT MODIFICATION OF THE RESIST STRUCTURES

(75) Inventors: Jörg Rottstegge, Lilienthal (DE); Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 102 days.

(21) Appl. No.: 10/356,775

(22) Filed: Jan. 31, 2003

(65) Prior Publication Data
US 2003/0143484 A1 Jul. 31, 2003

(30) Foreign Application Priority Data
Jan. 31, 2002 (DE) ............... 102 03 839

(51) Int. Cl.
*G03C 1/73* (2006.01)
*G03F 7/039* (2006.01)
(52) U.S. Cl. .......... 430/270.1; 430/326; 430/905; 430/907; 430/910; 430/914; 430/325
(58) Field of Classification Search ........ 430/270.1, 430/326, 905, 909, 910, 914
See application file for complete search history.

(56) References Cited

U.S. PATENT DOCUMENTS 5,905,016 A    5/1999  Kishimura ............ 430/270.1
6,136,502 A  * 10/2000  Satoshi et al. ........ 430/270.1
6,517,990 B1 *  2/2003  Choi et al. ............ 430/270.1
2002/0150835 A1 * 10/2002 Nishi et al. ........... 430/270.1
2003/0027075 A1 *  2/2003 Barclay et al. ........ 430/270.1
2003/0078354 A1 *  4/2003 Medina et al. ........ 430/270.1
2003/0152864 A1 *  8/2003 Araki et al. ........... 430/270.1

FOREIGN PATENT DOCUMENTS

EP    1 091 249 A1    4/2001
EP    1 120 689 A2    8/2001
WO    WO 01/74916 A1 * 10/2001

OTHER PUBLICATIONS

DERWENT English abstract for WO 01/74916 A1 (Aoyama et al.).*

* cited by examiner

*Primary Examiner*—Sin Lee
(74) *Attorney, Agent, or Firm*—Laurence A. Greenberg; Werner H. Stemer; Ralph E. Locher

(57) ABSTRACT

A photoresist contains a polymer that has no silicon-containing groups. Consequently, no expulsion of silicon-containing compounds in gaseous form occurs on exposure to short-wave radiation. The polymer is obtained by terpolymerization of a first comonomer having a group cleavable under acid catalysis, a second comonomer having an anchor group, and a monounsaturated hydrocarbon, in which individual carbon atoms of the carbon skeleton may also be replaced by oxygen, as a third comonomer. The polymer has a low glass transition temperature, and the photoresist therefore has a good layer quality on film formation and good structurability.

8 Claims, No Drawings

RESIST FOR PHOTOLITHOGRAPHY HAVING REACTIVE GROUPS FOR SUBSEQUENT MODIFICATION OF THE RESIST STRUCTURES

BACKGROUND OF THE INVENTION

Field of the Invention

The invention relates to a photoresist.

In the production of microchips, thin layers of a photoresist are used for structuring semiconductor substrates. The photoresist can be selectively changed in its chemical nature by exposure with the aid of a photomask or by direct exposure, for example an electron beam. After a development step in which the exposed or the unexposed parts of the photoresist are removed, a structured resist is obtained and is used as a mask, for example for etching the semiconductor substrate. During etching, the substrate disposed under the photoresist is removed in the exposed parts so that the structure predetermined by the mask is transferred to the substrate.

A photoresist suitable for the industrial production of microchips has to meet a multiplicity of requirements. For economic reasons, exposure times that are as short as possible are desired when transferring the structure defined by a photomask to the photoresist. To be able to achieve a comprehensive chemical modification of the photoresist even with low exposure intensities, most of the resists used at present operate with chemical amplification. The exposure initiates a photochemical reaction that catalyzes a change in the chemical structure of the photoresist. In chemically amplified photoresists, for example, a multiplicity of polar groups can be liberated by a single photon. In contrast to chemically unamplified photoresists, chemically amplified photoresists therefore have a quantum yield of more than 100%. In the case of a positive-working chemically amplified photoresist, a strong acid is produced from a photo acid generator by exposure, which acid, in a subsequent heating step, results in a catalytic conversion or cleavage of the resist. As a result of this chemical reaction, the solubility of the polymer in a developer is dramatically changed so that a substantial differentiation results between exposed and unexposed parts. For this purpose, the polymer contained in the photoresist contains, for example, nonpolar carboxylic acid tert-butyl ester groups, from which polar carboxyl groups can be liberated under acid catalysis.

In order to be able selectively to etch only the bare parts of the substrate, the structured photoresist must have sufficient resistance to the etching plasma. The action of an etching plasma can be divided approximately into a physical and a chemical part. The physical part results in virtually material-independent removal of material. The components of the plasma strike the substrate surface and knock out particles there. To achieve a differentiation between the sections covered by the resist mask and uncovered sections, the resist mask must therefore have a certain layer thickness so that a sufficient layer thickness of the resist is still present on the covered sections at the end of the etching process to protect those sections of the substrate surface which lie underneath. The chemical part of the etching process is based on a different reactivity of the plasma with respect to various materials. Thus, organic materials are converted in an oxygen plasma into gaseous compounds so that rapid removal of the material takes place, whereas organosilicon compounds are converted into silicon dioxide, which remains as a solid on the substrate surface and is removed only by the physical part of the etching action. Because the etch resistance of organosilicon compounds in the oxygen plasma differs substantially from that of organic hydrocarbon compounds, the polymer in a CARL (CARL=Chemical Amplification of Resist Lines) photoresist used for a wavelength of 248 nm includes silicon-containing groups which are converted into silicon dioxide during the etching and form a stable etch mask. The silicon-containing groups are bonded as side groups to the carbon chain of the polymer. However, this leads to difficulties if radiation of a shorter wavelength is used for the exposure of the photoresist. At an exposure wavelength as short as 193 nm and in particular at even shorter wavelengths, bonds in the polymer are broken owing to the high energy of the exposure radiation. Low molecular weight volatile cleavage products form from the silicon-containing side groups and are expelled in gaseous form from the photoresist. The silicon-containing cleavage products react slowly with residual oxygen present in the purge gas to give silicon dioxide that is deposited on the exposure lenses and damages them irreversibly. Polymer systems for exposure wavelengths of 193 nm or less should therefore contain no silicon-containing side groups.

If the etch resistance is not present from the outside, the photoresist can be chemically amplified with an amplification agent after the structuring, i.e. after exposure and development of the photoresist. For this purpose, the polymer contained in the photoresist includes anchor groups for the linkage of amplification reagents which increase the etch resistance of the photoresist. By incorporating further groups, it is simultaneously possible subsequently to increase the layer thickness of the photoresist. The anchor groups must have sufficient reactivity to undergo a reaction with a suitable group of the amplification agent within as short a reaction time as possible and to bond said agent to the polymer via a preferably covalent bond. Subsequent amplification of photoresists is possible, for example, by the CARL process described in European Patent EP 0 395 917 B1, which corresponds to U.S. Pat. Nos. 5,234,794 and 5,234,793. For this purpose, for example, maleic anhydride is incorporated as a comonomer into the polymer of the photoresist. The carboxylic anhydride group then serves as an anchor group that can be nucleophilically attacked, for example, by an amino group of the amplification agent. The amplification agent is then bonded to the polymer of the photoresist via an amide bond. In this way, for example, subsequent incorporation of organosilicon compounds into the resist structures is possible. This incorporation reaction is often referred to as silylation. In addition to silicon-containing groups, aromatic and polycyclic aliphatic groups can also be introduced into the polymer in order to increase the etch resistance. Introduction of aromatic groups is referred to as aromatization.

However, a major disadvantage of maleic anhydride is its poor ability to undergo free radical homopolymerization and moderate ability to undergo free radical or alternating copolymerization. Attempts have been made to overcome this difficulty by combining the electron-poor maleic anhydride with a comonomer that has an electron-rich polymerizable double bond. The polymer is then prepared in a donor-acceptor polymerization which takes place substantially more rapidly and simply. For example, the CARL resist described above generally contains allyltrimethylsilane as an electron-rich comonomer in addition to maleic anhydride. As already mentioned above, however, this resist is suitable only to a limited extent for exposure to radiation having a wavelength of 193 nm, owing to the expulsion of silicon-containing products in gaseous form.

The COMA resist system in which no expulsion of harmful byproducts in gaseous form is observed at 193 nm has been proposed as an alternative (cf. for example I. L. Rushkin et al., Proc. SPIE 3999 (2000), 214–219). The polymer of the COMA photoresist is prepared by terpolymerization of maleic anhydride, a polycyclic alkene, generally norbornene, and an unsaturated carboxylic acid protected by an acid-labile group, for example an acrylate or a norbornene functionalized with an acid-labile group (COMA="Cyclo-Olefin-Maleic Anhydride"). As a result of incorporating the polycyclic radicals, however, the polymer chain becomes very immobile and it is for this reason that COMA resists have a high glass transition temperature of up to 200° C. This leads to sacrifices in the layer quality of the photoresist films produced from the COMA photoresist.

After the application, the photoresist is generally heated for a short time so that the solvent evaporates and the softened polymer or the resist forms as homogeneous a film as possible through a rearrangement of the polymer chains. Cavities or pores that are formed during application of the photoresist or during evaporation of the solvent are predominantly closed. If the polymer contained in the photoresist has too high a glass transition temperature, cavities remain in the resist film and, owing to the internal surface, form barriers to the diffusion of the strong acid in the heating step that is carried out after the exposure (PEB=post exposure bake).

In the exposure of the photoresist, acid is first liberated from a photo acid generator. After the exposure, the acid begins to diffuse in the photoresist, with the result that the crispness of the reproduced structure is reduced. In the baking step, the acid-labile groups of the polymer are therefore also cleaved in the boundary region with the unexposed sections into which the acid has diffused. The diffusion, in particular the diffusion length of the liberated strong acid, is influenced by the glass transition temperature of the resist polymer and by the quality of the film. Owing to the height of the glass transition temperature of many COMA resists and their generally poor film formation properties, which lead to a spongy film structure, structures having a very rough edge are therefore often obtained in the case of COMA resists.

Furthermore, a film having a homogeneous structure, as obtained by heating, has a higher mechanical strength than a film having a foam-like or spongy structure. Owing to the denser structure, gaseous contaminations, which are introduced, for example, from the surrounding air, could also penetrate into deeper resist layers or evaporate from the resist only to a smaller extent. The sensitivity of the resist to contamination is thus reduced by good film quality and pot life effects after exposure are suppressed.

In order to reduce the glass transition temperature $T_g$ of the polymer and hence to improve the quality of the photoresist, a VEMA photoresist has been proposed by S.-J. Choi, H.-W. Kim, S.-G. Woo and J.-T. Moon, Proc. SPIE Vol. 3999 (2000), 54–61. The polymer of this resist is obtained by terpolymerization of a vinyl ether, maleic anhydride, and an acrylate, which has been esterified with an acid-labile alicyclic radical, such as 8-ethyl-8-tricyclodecanyl or 2-methyl-2-adamantyl (VEMA=Vinyl Ether-Maleic Anhydride). Owing to the vinyl ether, the carbon chain of the polymer acquires a higher flexibility, and the glass transition temperature $T_g$ of the polymer therefore decreases.

The CARL resist described above is already used in the industrial production of microchips for exposure to radiation having a wavelength of 248 nm, so that considerable experience of its production and process is available. Furthermore, broad experience has been obtained in the subsequent amplification of the developed resist in the liquid phase, for example by liquid silylation, so that there is a need for continued development of the CARL resist and adaptation to shorter wavelengths of 193 nm or less.

SUMMARY OF THE INVENTION

It is accordingly an object of the invention to provide a resist for photolithography having reactive groups for subsequent modification of the resist structures that overcomes the hereinafore-mentioned disadvantages of the heretofore-known devices of this general type and that, at exposure wavelengths of 193 nm or less, does not emit any low molecular weight silicon-containing compounds in gaseous form, has high etching resistance in the plasma, permits the production of very fine structures on a wafer surface and has sufficiently good film formation properties to ensure optimum wetting of the substrate.

With the foregoing and other objects in view, there is provided, in accordance with the invention, a chemically amplified photoresist with a film-forming polymer, a photo acid generator, and a solvent or solvent mixture. The film-forming polymer is obtained by copolymerization of three comonomers. The first comonomer has a group cleavable under acid catalysis, which includes a monocyclic, straight-chain, or branched alkyl group in which one or more carbon atoms may also be replaced by oxygen. The second comonomer has at least one nucleophilically attackable anchor group for binding amplification agents. The third comonomer has a carbon-carbon double bond that is capable of free radical polymerization and is formed by a monounsaturated monocyclic, straight-chain, or branched alkene, in which one or more of the carbon atoms may also be replaced by an oxygen atom.

The polymer of the photoresist according to the invention is prepared by copolymerization of various comonomers that perform different functions and, independently of one another, can be varied according to the requirements.

With the first comonomer, a group cleavable under acid catalysis is introduced into the polymer. As a result of the cleavage of which group, the polarity of the polymer and hence its solubility in a developer solution, in general an aqueous alkaline developer solution, can be influenced in a specific manner. The group cleavable under acid catalysis preferably has a group with acidic properties, such as a carboxyl group or an acidic hydroxyl group. These acidic groups are protected by an acid-labile group via an ester or ether bond, so that their acidic properties are not initially displayed and the polymer has nonpolar properties. An example of a suitable ester is cyclohexylethyl ester.

The groups cleavable under acid catalysis are bonded as side chains for the polymer main chain formed from carbon atoms. In order to obtain a lower sensitivity to contaminations from the air and better pot lives between exposure step and baking step, the polymer should have a low glass transition temperature $T_g$ of, preferably, from 100 to 150° C., i.e. the polymer chain should have high mobility in order to be able to improve the structure of the photoresist film after application in a heating step. According to the invention, those groups that have a small steric requirement in comparison with the alicyclic acid-labile groups used in the VEMA resist are therefore used as acid-labile groups. This has the further advantage that cleavage of the group cleavable under acid catalysis gives small cleavage products that can be expelled from the photoresist layer during the baking step. Thus, the cleavage of the group cleavable under acid catalysis takes place rapidly and completely so that the thermal load on the photoresist layer during the baking step (PEB) can be reduced. The acid-labile group includes a monocyclic, straight-chain or branched alkyl group which is preferably linked to the carbon chain of the polymer via an ether bond or an ester bond. These acid-labile groups preferably include four (4) to ten (10) carbon atoms. The cyclic groups are preferably in the form of five- or six-membered rings. For improving the adhesion of the polymer to the substrate, one or more carbon atoms of the carbon skeleton of these acid-labile groups may also be replaced by oxygen.

The second comonomer contains an anchor group that makes it possible subsequently to bind a chemical amplification agent to the polymer of the photoresist. The amplification agent can subsequently increase the dry etching resistance of the photoresist by introducing, for example, silicon-containing groups or groups with aromatic or polycyclic groups into the polymer. Furthermore, the resist profiles can be subsequently modified by the amplification in order, for example, to increase the layer thickness of the photoresist or to reduce the width of the trenches disposed between the resist profiles. The anchor group is preferably nucleophilically attackable.

The third comonomer improves the copolymerization properties of the comonomers and optimizes further important material properties, such as the film formation properties, the glass transition temperature, which characterizes the transition from the crystalline to the amorphous state, and the polarity of the polymer. The polarity of the polymer controls the hydrophilic properties and hydrophobic properties and other substantial wetting features. Compounds that have a carbon-carbon double bond capable of free radical polymerization and that are formed from a monounsaturated monocyclic, straight-chain or branched alkene are used as third comonomers. In this context, monounsaturated means that the third comonomer includes exactly one double bond capable of free radical polymerization, i.e. there is a completely saturated repeating unit in the polymer. In order to improve the adhesion of the polymer on the substrate, one or more of the carbon atoms of the carbon skeleton of the third comonomer can also be replaced by an oxygen atom. The third comonomer causes the polymer of the photoresist according to the invention to acquire greater flexibility and decrease the glass transition temperature of the polymer. Thus, through the choice of the third comonomer, the sensitivity of the photoresist film to contamination from the surrounding air can thus be reduced and the pot life behavior of the exposed photoresist film can be improved because, in the heating step carried out after application of the photoresist film, a rearrangement of the polymer chains and hence an improvement in the layer quality are possible. A further advantage is obtained in the preparation of the polymer since the third comonomer makes it possible to increase the reaction rate. The third comonomer has a double bond with a relatively high electron density in comparison with, for example, maleic anhydride, which can preferably be used as a second comonomer. If a second comonomer having an electron-poor double bond is used, the polymerization therefore takes place as a donor-acceptor reaction. Such a reaction takes place substantially more easily and rapidly than a homopolymerization of, for example, maleic acid and therefore leads to an increase in the yield in the preparation of the polymer. The third comonomer preferably includes 3 to 20 carbon atoms, particularly preferably 3 to 10 carbon atoms. If the number of carbon atoms bonded to the polymerizable double bond is too high, the flexibility of the carbon chain of the polymer decreases again, i.e. the glass transition temperature $T_g$ increases, owing to the steric hindrance. On the other hand, long alkyl chains reduce the glass transition temperature.

The polymers contained in the photoresist according to the invention can be prepared by customary polymerization processes. The free radical polymerization is initiated by adding a free radical initiator, for example benzoyl peroxide or AIBN, or by high-energy radiation. The polymerization can be carried out in solution or without a solvent, as a mass polymerization. Suitable solvents for a polymerization in solution are, for example, tetrahydrofuran and butanone.

In addition to the polymer, the photoresist according to the invention contains a photo acid generator. Photo acid generators which may be used are all compounds which liberate acid on exposure to the exposure radiation and have as high a quantum yield as possible. Ionic compounds in the form of sulfonium salts or iodonium salts are preferably used as photo acid generators. For example, onium compounds, as described in DE 19820477, are suitable.

For example, methoxypropyl acetate, oligoethylene glycol ether, cyclopentanone, cyclohexanone, γ-butyro-lactone, or ethyl lactate can be used as a solvent for the photoresist. Mixtures of at least two of these solvents also may be used. In general, all conventional photoresist solvents or mixtures thereof may be used provided that they permit the preparation of a clear, homogeneous solution of the resist components which has a long shelf life and a good layer quality of the resist film is achieved on coating of a substrate.

The components described to date are used in the resist according to the invention preferably in the following ratios:
film-forming polymer: from 1 to 50% by weight, preferably from 2 to 8% by weight;
photo acid generator: from 0.01 to 10% by weight, preferably from 0.05 to 0.5% by weight;
solvent: from 50 to 99% by weight, preferably from 92 to 97% by weight.

In addition to said components, the chemically amplified resist may also contain further customary components. For example, it may contain a thermo acid generator which liberates an acid on heating. The temperature at which the thermo acid generator liberates an acid must be above the temperature at which the elimination of the acid-labile groups in the exposed parts of the photoresist takes place. The thermo acid generator is contained in the photoresist in general in an amount of from 0.01 to 5% by weight, preferably from 0.05 to 1% by weight. Suitable thermo acid generators are, for example, benzylthiolanium compounds. With the aid of the thermo acid generator, the acid-labile groups can be eliminated in the structured resist by heating and hence polar groups can be liberated, which polar groups serve as anchor groups for anchoring the amplification agent.

In addition, further components can be added to the photoresist as additives which influence the resist system advantageously with respect to resolution, film formation properties, shelf life, radiation sensitivity, pot life effects, etc.

Other features that are considered as characteristic for the invention are set forth in the appended claims.

Although the invention is illustrated and described herein as embodied in a resist for photolithography having reactive groups for subsequent modification of the resist structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying examples.

DESCRIPTION OF THE PREFERRED EMBODIMENTS

With respect to the examples and embodiments described below, the first comonomer preferably includes, as groups, catalytically cleavable by acid, tert-alkyl ester, tert-butyl ester, tert-butoxycarbonyloxy, tetrahydro-furanyloxy, tetrahydropyranyloxy, or acetal groups. Tert-Butyl ester groups are particularly preferred. The acid-catalyzed cleavage of a tert-butyl ester group gives isobutene, which, owing to its high volatility, is rapidly removed from the reaction equilibrium, with the result that the reaction equilibrium shifts in favor of the liberated carboxyl groups.

The first comonomer is preferably selected from a group including acrylic acid, methacrylic acid, cyclohexenecarboxylic acid, norbornenecarboxylic acid, maleic acid, itaconic acid, cyclohexenedicarboxylic acid, norbornenedicarboxylic acid, and all monoesters of these dicarboxylic acids with any desired alcohols, the free carboxyl group of the acid being esterified with an acid-labile protective group, so that the abovementioned groups cleavable under acid catalysis are obtained. The acid-labile esters of acrylic acid, methacrylic acid and cyclohexenecarboxylic acid are particularly preferably used. The acidic monoesters of the dicarboxylic acids can be prepared by alcoholysis of the corresponding acid anhydrides with a suitable alcohol, preferably methanol or ethanol. The free carboxyl group of the acidic monoester is then esterified with an acid-labile group, preferably to give the tert-butyl ester.

The third comonomer is particularly preferably a monounsaturated cyclic hydrocarbon or a straight-chain or branched hydrocarbon. In this embodiment, the third comonomer carries no further functional groups. These monounsaturated hydrocarbons are generally easily and economically obtainable, which is advantageous from economic points of view.

According to a first embodiment, the monounsaturated straight-chain or branched hydrocarbon includes a terminal polymerizable carbon-carbon double bond.

The alkenes having a terminal double bond may have a branched structure. Straight-chain alkenes are particularly preferred, the monounsaturated straight-chain hydrocarbon satisfying the general structural formula $CH_2=CH-(CH_2)_n-CH_3$, in which n is an integer from 0 to 10. Preferred examples of these monounsaturated hydrocarbons are 1-heptene, 1-octene, and 1-decene.

According to a second embodiment, the monounsaturated straight-chain or branched hydrocarbon includes a non-terminal polymerizable carbon-carbon double bond. Examples of suitable compounds are 2-heptene, 3-octene, and 4-decene.

According to a further preferred embodiment, cycloalkenes are used as the third comonomer. Cycloalkenes having a 5-, 6-, 7-, or 8-membered ring may be used here. It is also possible for these rings to carry alkyl groups as substituents. Cyclohexene is particularly preferably used as a third comonomer. Further suitable compounds are cyclopentene, cyclo-heptene, and cyclooctene.

According to a further preferred embodiment, the third comonomer is an ether having a monounsaturated alkenyl radical, bonded to the oxygen of the ether bond, and a straight-chain or branched alkyl radical or alkoxyalkylene radical bonded to the oxygen of the ether bond. The alkoxyalkylene radical forms a polyether chain with which, for example, the adhesion of the resist on a substrate can be positively influenced.

The monounsaturated alkenyl radical is particularly preferably a vinyl radical or an allyl radical. Thus, allyl or vinyl ethers are preferably used as third comonomers. The vinyl radical is preferably branched, i.e. the hydrogen atom on the central carbon atom is substituted by a group, in particular an alkyl group or a cyano group.

The ether preferably has a structure of the formula $CH_2=CR^1-R^2-O-R^3$, in which:

$R^1$ is a hydrogen atom or a methyl or cyano group, $R^2$ is a single bond, a divalent linear, or branched alkylene group having one to 10 carbon atoms, and $R^3$ is a monovalent alkyl group having one to 10 carbon atoms, $R^2$ not being a single bond when $R^1$ is a hydrogen atom.

An anchor group is introduced into the polymer of the photoresist via the second comonomer. An anchor group is understood as meaning a group that permits subsequent linkage of an amplification agent. For this purpose, the amplification agent has a corresponding group, in particular a nucleophilic group. In the amplification of the structured resist, the amplification agent is preferably bonded to the polymer via a covalent bond. A distinction is made between reactive anchor groups, which can react directly with the amplification agent without prior activation or elimination of protection, by virtue of the fact that said amplification agent nucleophilically attacks the reactive anchor group with formation of a preferably covalent bond, and unactivated anchor groups, which are generally present in protected form in the polymer and may not react with the amplification agent until after elimination of protection. These anchor groups bind the amplification agent generally via noncovalent bonds, i.e. for example by ionic or dipole-dipole interactions. The formation of a covalent bond can then take place after further supply of energy, for example by heating. An example of such unactivated anchor groups includes carboxyl groups that may have been protected with an acid-labile group and which may bind an amplification agent via an ionic bond, for example as an ammonium salt, or a covalent bond, for example an amide bond, only after elimination of protection. Examples of second comonomers having unactivated anchor groups are acrylic acid, methacrylic acid, cyclohexenecarboxylic acid, norbornenecarboxylic acid, maleic acid, itaconic acid, cyclohexenedicarboxylic acid, norbornenedicarboxylic acid, and the acidic monoesters of these dicarboxylic acids with any desired alcohols, for example methanol or ethanol. If the acids are protected with an acid-labile group, first and second comonomers may also be identical. However, the anchor group is preferably in the form of a reactive anchor group, since in this case the polymer can be reacted with an amplification agent without prior activation or elimination of protection. Examples of suitable reactive anchor groups are carboxylic anhydrides, isocyanates and thioisocyanates. The second comonomer particularly preferably has a carboxylic anhydride group as an anchor group. This group has sufficient reactivity to permit subsequent amplification of the resist in periods of interest for industrial applications. Furthermore, there is extensive experience in the processing of the CARL resist to enable said experience to be applied to the photoresist according to the invention. Examples of suitable second comonomers having reactive anchor groups are maleic anhydride, itaconic anhydride, cyclo-hexenedicarboxylic anhydride, norbornene-dicarboxylic anhydride, and methacrylic anhydride.

The polymer contained in the photoresist according to the invention is free of silicon-containing groups and hence not critical with regard to its devolatilization behavior. As a result of using the third comonomers as described above, the copolymerization properties of the mixture of first to third comonomers is improved, in particular with the use of maleic anhydride as a second comonomer. The photoresist is suitable in particular for exposure wavelengths of less than 200 nm, and for electron-beam and ion projection lithography. Owing to the reactive groups contained in the polymer and intended for chemical amplification of the resist structure, for example by silylation, a subsequent increase in the etching resistance and a subsequent modification of the structured photoresist are possible.

The photoresist according to the invention is applied to the substrate by customary techniques, for example by spin-coating or spraying on. The substrate used is in general a silicon wafer, which may also already have undergone structuring steps and may therefore already include structures or microelectronic components. In this case, a bottom resist may also first be applied in order to compensate irregularities on the surface of the substrate and to be able to ensure reliable focusing of the radiation used for exposure in the layer of the resist according to the invention. After removal of the solvent by drying and any heating step carried out, the dried resist layer is exposed. As a result of the exposure, a proton is liberated from the photo acid generator and leads to the elimination of the acid-labile protective groups in the exposed parts. The acid initially forms a latent image, i.e. the distribution of the acid in the photoresist corresponds to the exposed parts. By eliminating the acid-labile groups, polar groups are liberated on the polymer and the latent acid image is imprinted in the polymer. The polymer changes its chemical character, i.e. parts in which the polymer has an increased polarity are formed in the resist. In the photoresist, a chemical profile is therefore produced in the surface. By heating the resist, the elimination of the acid-labile groups is accelerated. Since the proton acts as a catalyst in the elimination of the acid-labile protective groups, a multiplicity of acid-labile protective groups can be eliminated by a liberated proton. This leads to greater contrast of the latent image produced by the exposure. Alkali-soluble groups, such as carboxyl groups or acidic hydroxyl groups, are liberated by eliminating the acid-labile protective groups. As a result of this, the solubility of the polymer in alkaline aqueous developers is differentiated in the exposed and unexposed parts of the photoresist. If the resist is therefore treated with an alkaline aqueous developer, for example tetramethylammonium hydroxide, only the exposed parts are removed from the substrate. A structured resist is now obtained on the substrate. Said resist can then be modified in its properties, for example its etching resistance to an oxygen plasma, by treatment with an amplification agent. If the anchor groups are already present in a reactive form in the polymer, for example as carboxylic anhydride groups, a solution of the amplification agent can be applied directly to the already structured resist. If the anchor groups are present in protected form, they are first liberated. For this purpose, the structured resist can, for example, be exposed to a floodlight and then heated. The polar groups are now also liberated in the unexposed parts of the photoresist and then act as anchor groups for linkage of the amplification agent. Amplification agents which may be used are, for example, aromatic compounds which increase the layer thickness so that the duration for which the resist structure is removed in an etch plasma is increased. As an alternative, silicon-containing amplification agents may be used. An $SiO_2$ film then forms in an oxygen plasma and protects the resist layers underneath from removal by the oxygen plasma.

The amplification agent can be applied to the structured resist from the gas phase or, preferably, as a solution in a suitable solvent.

Suitable basic silylation reagents are amino-functionalized organosilicon compounds, such as, for example, aminosiloxanes. For example, chain-like dimethylsiloxanes having terminal aminopropyl units and 1 to 50, preferably 2 to 12, silicon atoms per molecule are particularly suitable. Such amplification agents are represented, for example, by the following general structural formula:

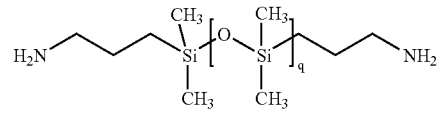

where q=0–49.

Further examples of amplification agents having amino-functional but also other functional groups are shown below:

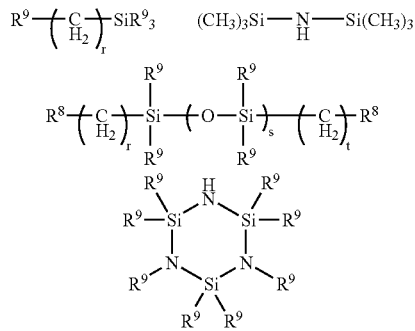

in which s is an integer from 0 to 30, r and t independently are each an integer from 0 to 10, $R^9$, in each case independently for each position, are H, alkyl, aryl, or cycloalkyl, and $R^8$, in each case independently for each position, are

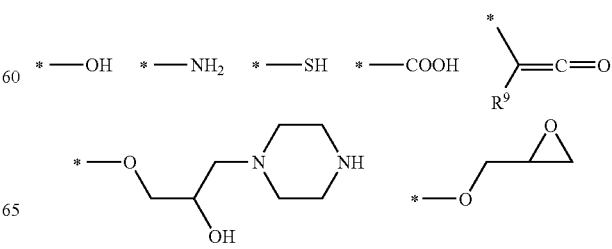

-continued

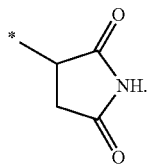

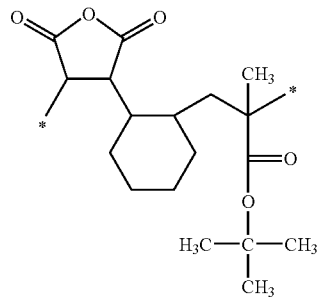

Silsesquioxanes are also suitable as amplification agents.

If the amplification agent is applied in solution to the resist, suitable solvents are, for example, hexanol, isopropanol, heptane, decane, or a mixture of at least two of these solvents. In general, however, it is possible to use all customary solvents that are not acidic or basic or mixtures thereof, and which are capable of taking up the components of the amplification agent to give a clear, homogeneous solution having a long shelf life.

The reaction of the amplification agent with the anchor groups or the film-forming monomer can be improved by reaction accelerators. Suitable reaction accelerators for the silylation for the swelling and stabilization of the reaction products are, for example, water, low molecular weight alcohols, such as, for example, methanol or ethanol, and low molecular weight aldehydes and ketones, such as, for example, acetone.

The invention is explained in more detail below with reference to an example.

A copolymer is synthesized from the comonomers maleic anhydride (44 mol %), tert-butyl methacrylate (33 mol %), and cyclohexene (22 mol %), as a structurable polymer. The comonomers, in a metered batch, are subjected to free radical polymerization with AIBN as an initiator in butanone. The batch vessel contains the monomers maleic anhydride and cyclohexene and 30% of the tert-butyl methacrylate in butanone as a solvent with 50% of the initiator. In the course of two hours, the remaining 70% of the tert-butyl methacrylate and the second half of the initiator AIBN in butanone are metered into the reaction mixture.

After polymerization is complete (12 hours), a part of the maleic anhydride is cleaved by methanol to give the acidic monoester. For purification, the polymer is precipitated first in isopropanol/water and then in heptane. A photoresist including a three-percent (3%) strength by weight solution of the polymer in methoxypropyl acetate, a photo acid generator and a base for establishing the sensitivity is produced from the dried polymer. The photoresist is applied to a silicon wafer by spin-coating, so that a thin film is obtained. The wafer coated with the film is placed briefly on a hotplate to evaporate the solvent. After cooling to room temperature, the coated wafer is exposed to a wavelength of 248 or 157 nm. The exposed wafer is heated (PEB) to eliminate the tert-butyl groups and then developed with an aqueous tetrabutylammonium hydroxide solution. The exposed parts of the photoresist could be completely removed from the wafer.

The fundamental structure of the polymer is shown below.

We claim:

1. A chemically amplified photoresist, comprising:
   a film-forming polymer obtained by copolymerizing:
      a first comonomer having a group cleavable under acid catalysis, said group being selected from the group consisting of a monocyclic alkyl group, a straight-chain alkyl group, and a branched alkyl group,
      a second comonomer having an anchor group for binding amplification agents, and
      a third comonomer having a non-vinylic carbon-carbon double bond capable of free radical polymerization and formed by a moiety selected from the group consisting of a straight-chain alkene and a branched alkene, said alkene of said third comonomer of said film-forming polymer having a carbon atom replaced by an oxygen atom;
   a photo acid generator; and
   a solvent.

2. A chemically amplified photoresist, comprising:
   a film-forming polymer obtained by copolymerizing:
      a first comonomer having a group cleavable under acid catalysis, said group being selected from the group consisting of a monocyclic alkyl group, a straight-chain alkyl group, and a branched alkyl group,
      a second comonomer having an anchor group for binding amplification agents, and
      a third comonomer having a non-vinylic carbon-carbon double bond capable of free radical polymerization and formed by a moiety selected from the group consisting of a straight-chain alkene and a branched alkene, said third comonomer being selected from the group consisting of a straight-chain hydrocarbon and a branched hydrocarbon, said straight-chain hydrocarbon and said branched hydrocarbon each including a respective non-terminal polymerizable carbon-carbon double bond;
   a photo acid generator; and
   a solvent.

3. A chemically amplified photoresist, comprising:
   a film-forming polymer obtained by copolymerizing;
      a first comonomer having a group cleavable under acid catalysis, said group being selected from the group consisting of a monocyclic alkyl group, a straight-chain alkyl group, and a branched alkyl group,
      a second comonomer having an anchor group for binding amplification agents, and
      a third comonomer having a non-vinylic carbon-carbon double bond capable of free radical polymerization and formed by a moiety selected from the group consisting of a straight-chain alkene and a branched alkene, said third comonomer being an ether with an oxygen forming an ether bond and having a monounsaturated alkenyl radical bonded to said oxygen of said ether bond, and a substituent further bonded to said oxygen of said ether bond and selected from the group consisting of a straight-chain alkyl radical, branched alkyl radical, and alkoxyalkylene radical;
a photo acid generator; and
a solvent.

4. The chemically amplified photoresist according to claim 3, wherein said monounsaturated alkenyl radical is an allyl radical.

5. The chemically amplified photoresist according to claim 3, wherein:
said ether has a structure of $CH_2=CR^1-R^2-O-R^3$;
$R^1$ is a substituent selected from the group consisting of a hydrogen atom, a methyl group, and a cyano group;
$R^2$ is a substituent selected from the group consisting of a single bond, a divalent linear alkylene group having from one to ten carbon atoms, and a divalent branched alkylene group having from one to ten carbon atoms, $R^2$ not being said single bond when $R^1$ is said hydrogen atom; and
$R^3$ is a monovalent alkyl group having from one to ten carbon atoms.

6. A chemically amplified photoresist, comprising:
a film-forming polymer obtained by copolymerizing:
a first comonomer having a group cleavable under acid catalysis, said group being selected from the group consisting of a monocyclic alkyl group, a straight-chain alkyl group, and a branched alkyl group,
a second comonomer having an anchor group for binding amplification agents, said anchor group of said second comonomer being a carboxylic anhydride group that is nucleophilically attackable, and
a third comonomer having a non-vinylic carbon-carbon double bond capable of free radical polymerization and formed by a moiety selected from the group consisting of a straight-chain alkene and a branched alkene;
a photo acid generator; and
a solvent.

7. The chemically amplified photoresist according to claim 6, wherein said carboxylic anhydride group of said second comonomer is selected from the group consisting of a maleic anhydride, an itaconic anhydride, a cyclohexenedicarboxylic anhydride, a norbornenedicarboxylic anhydride, and a methacrylic anhydride.

8. A chemically amplified photoresist, comprising:
a film-forming polymer obtained by copolymerizing:
a first comonomer having a group cleavable under acid catalysis, said group being selected from the group consisting of a monocyclic alkyl group, a straight-chain alkyl group, and a branched alkyl group,
a second comonomer having an anchor group for binding amplification agents, and
a third comonomer having a nonvinylic carbon-carbon double bond capable of free radical polymerization and formed by a moiety selected from the group consisting of a straight-chain alkene and a branched alkene; said third comonomer being an ether with an oxygen forming an ether bond and having a monounsaturated alkenyl radical bonded to said oxygen of said ether bond, and a substituent further bonded to said oxygen of said ether bond and selected from the group consisting of a straight-chain alkyl radical and a branched alkyl radical; said ether having a structure of $CH_2=CR^1-R^2-O-R^3$; $R^1$ being a substituent selected from the group consisting of a hydrogen atom, a methyl group, and a cyano group; $R^2$ being a substituent selected from the group consisting of a single bond, a divalent linear alkylene group having from one to ten carbon atoms, and a divalent branched alkylene group having from one to ten carbon atoms, $R^2$ not being said single bond when $R^1$ is said hydrogen atom; and $R^3$ being a monovalent alkyl group having from one to ten carbon atoms;
a photo acid generator; and
a solvent.

* * * * *